United States Patent
Baumgaertl et al.

(10) Patent No.: US 6,897,758 B1
(45) Date of Patent: May 24, 2005

(54) METHOD FOR REPRODUCING DIRECT CURRENTS AND A DIRECT CURRENT TRANSFORMER FOR CARRYING OUT SAID METHOD

(75) Inventors: Ulrich Baumgaertl, Berlin (DE); Henry Franke, Berlin (DE); Holger Hochgraef, Ganzer/Wusterhausen (DE); Wolfgang Roehl, Berlin (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 09/787,778

(22) PCT Filed: Sep. 22, 1999

(86) PCT No.: PCT/DE99/03088

§ 371 (c)(1),
(2), (4) Date: Jun. 18, 2001

(87) PCT Pub. No.: WO00/17663

PCT Pub. Date: Mar. 30, 2000

(30) Foreign Application Priority Data

Sep. 22, 1998 (DE) .......................................... 198 45 778

(51) Int. Cl.$^7$ ............................................. H01F 17/06
(52) U.S. Cl. ...................................................... 336/175
(58) Field of Search ........................ 336/83, 173–175, 336/177–178; 323/357–358

(56) References Cited

U.S. PATENT DOCUMENTS 5,053,697 A   10/1991  Carnel et al.
6,064,191 A * 5/2000  Turner ........................ 324/127

FOREIGN PATENT DOCUMENTS

| DE | A1-2409247 | 9/1975 |
|----|-----------|--------|
| DE | A-2601252  | 6/1977 |
| DE | 155220     | 5/1982 |
| DE | A1-3835100 | 4/1989 |
| DE | C1-3815100 | 12/1989 |
| DE | C2-4230939 | 4/1995 |
| EP | A2294590   | 12/1988 |
| EP | A2651258   | 5/1995 |
| EP | A1686850   | 12/1995 |
| GB | A2029973   | 3/1980 |
| GB | A2137764   | 10/1984 |

OTHER PUBLICATIONS

Petter et al., Proceedings of the Nuclear Science Symposium and Medical Imaging Conference, pp. 961–967 (1991).

* cited by examiner

*Primary Examiner*—Tuyen T Nguyen
(74) *Attorney, Agent, or Firm*—Harness, Dickey & Pierce, P.L.C.

(57) ABSTRACT

The circuit contains a primary coil on the core (2) of a magnetic circuit with an air gap and switchable into a line carrying the measurement current. A secondary compensation coil (5), with an order higher winding count and mounted on the core, is connected to the output of a controllable compensation current source (6). The output of a Hall element (11) in the air gap is connected to the control input of the compensation source.

A further coil (14) on the core is connected to an additional controllable current generator (15) whose control input (16) is driven by a measurement device (13) for the compensation current via a control and evaluation circuit (17).

USE/ADVANTAGE—Measuring a.c. and d.c. Can be produced at low cost and all drift occurring during measurement can be compensated.

12 Claims, 5 Drawing Sheets

METHOD FOR REPRODUCING DIRECT CURRENTS AND A DIRECT CURRENT TRANSFORMER FOR CARRYING OUT SAID METHOD

This application is the national phase under 35 U.S.C. §371 of PCT International Application No. PCT/DE99/03088 which has an International filing date of Sep. 22, 1999, which designated the United States of America.

FIELD OF THE INVENTION

The invention relates to a method for reproducing direct currents, in particular for use in DC switchgear, with the aid of a primary winding through which the direct current to be measured flows and which is magnetically coupled to a secondary winding via an iron core. It further relates to a direct current transformer which is suitable for carrying out the method.

BACKGROUND OF THE INVENTION

The detection of currents in DC circuits is associated with greater technical problems than such detection of currents in AC circuits, in which transmission to a measurement device or to a tripping circuit of a switching device can be carried out using magnetic transformers.

Furthermore, there is the requirement for low-voltage switchgear for the measurement to be carried out as far as possible from the system, that is to say without providing external energy from an additional energy source which provides an auxiliary voltage. This is also only a minor problem in AC networks, or at least with an energy source having only a low power level.

It is known for the primary current to be measured using magnetic devices, that is to say with the aid of Hall probes or magnetoresistive sensors. However, it has been found that this method is not very suitable, at least for the preferred situation here, since the primary current cannot be reproduced with sufficient accuracy. As such, spurious tripping of the overcurrent release can thus easily occur.

It is also known for a measurement resistor (shunt) to be inserted in the primary circuit and for the voltage to be supplied via this measurement resistor to an isolating amplifier, whose output side acts on the tripping circuit. However, this solution is technically highly complex owing to the requirements which the isolating amplifier has to satisfy. Furthermore, there is a continuous, high power loss in the measurement resistor.

EP-A 0 651 258 discloses a measurement method for direct currents, in which the primary conductor is magnetically coupled to a field winding via an iron core. The latter is energized with a regular, triangular-waveform alternating current, which allows pulses to be produced at regular intervals in a further winding, which is used as a measurement coil. If the iron core is now premagnetized in one direction or the other by means of the primary direct current, then the shift in the hysteresis curve of the iron core changes the interval between the measured pulses, and this can be evaluated as a measure of the primary current to be measured. This solution is likewise very complex in terms of circuitry and requires the continuous provision of an auxiliary voltage with a corresponding power level, thus resulting in a not inconsiderable energy requirement.

A further method for measuring direct currents is based on the use of a field winding to compensate for a magnetic field caused by the direct current in an iron core. The magnetic field in an air gap in the iron core is measured using a magnetic field sensor, in order to control the compensation current in the field winding. The current flowing in the field winding once compensation has been carried out, that is to say once the total field measured by the magnetic field sensor has become zero, is used as a measure of the primary direct current. The method is known, for example, from EP-A 0 294 590 or from DE-A 38 15 100.

A further option with the aid of magnetic field compensation is described in UK-A 2 029 973. According to this solution, a current in the form of a ramp is fed continuously and repeatedly into the compensation winding and the magnetic field in the iron core is measured via an indicator winding.

The compensation method likewise requires a considerable amount of energy to provide a continuous compensation current, and is thus not suitable for the above-mentioned purpose.

SUMMARY OF THE INVENTION

The invention is based on the object of specifying a measurement method. In one aspect, it involves a direct current transformer, by means of which direct currents can be reproduced as accurately as possible and using considerably less energy.

According to the invention, the object is achieved by integration of the current signal which is supplied from the secondary winding of an iron core where the current to be measured flows through a primary winding, and by the integrated current value being supplied to a measurement device or to a trigger circuit of a switching device. The integrated current value is preferably adjusted at predetermined time intervals by determining the primary current to be measured with the assistance of a magnetic field sensor, for measuring the magnetic field in the iron core. This is achieved using a compensation method in which the magnetic field in the iron core is set to zero by means of a current, in the opposite direction to the primary current, in a compensation winding, and by the integrated current value being corrected to this value.

The method can expediently be carried out such that the secondary winding is used as the compensation winding for the measurement based on the compensation method.

The compensation method can advantageously be carried out such that a linear-rising direct current is fed into the secondary winding or into a separate compensation winding.

The method manages with only a fraction of the energy required by previously known DC/DC converters, since the compensation method is carried out only at time intervals in order to compensate for the drift in the current value determined using the integration method.

According to the invention, a direct current transformer which is suitable for carrying out the method has a primary winding, through which the primary direct current to be measured flows, and a secondary winding. The windings are magnetically coupled via an iron core. The device further includes a magnetic field sensor for measuring the magnetic field of the iron core and an integration circuit which is connected to the secondary winding, and whose output is connected to a measurement device or to a trigger circuit of a switching device. Finally, a compensation circuit is connected to the secondary winding via a changeover switch, or is connected to a separate compensation winding wound on the iron core. This compensation circuit includes a controllable DC source and an evaluation circuit which processes the current value of the DC source when the magnetic field has been compensated, that is to say when the magnetic flux is equal to zero, in order to adjust the integration circuit.

The magnetic field sensor may be a Hall probe, a magnetoresistive sensor or an indicator winding into which a balanced alternating current is injected and whose voltage imbalance or balance is a measure of the magnetic field in the iron core.

The iron core is expediently provided with an air gap, in which or in whose vicinity the magnetic field sensor is arranged.

The secondary winding supplies a signal which corresponds to the di/dt of the primary direct current. The downstream evaluation circuit, preferably based on a microprocessor, integrates the signal from the secondary winding to form the primary direct current. It can then use this value in a known manner to carry out the overcurrent protection.

Determination of the primary current necessitates long-term integration, in which minor errors over very long times can lead to major discrepancies between the calculated value and the true primary current, so that an overcurrent release would operate unnecessarily. In order to avoid this undesirable long-term effect, the current is measured at certain time intervals with the aid of the magnetic field sensor. For this purpose, a direct current which starts from zero and ramps up linearly with time is fed into the secondary winding or into a separate compensation winding. At the same time, the output signal from the magnetic field sensor is monitored. When a reversal point or a change in polarity occurs in the signal, depending on the type of magnetic field sensor used, then the magnetic field in the air gap is zero. Further, the compensation current, multiplied by the number of turns on the secondary or compensation winding, is equal to the primary current. This is then used to correct the previously integrated current value. After this, the current can once again be detected by integration.

If an indicator winding on the iron core is used for the magnetic field measurement, then a balanced alternating current is injected into this indicator winding. The voltage is measured in parallel with the indicator winding. If the magnetic field is not equal to zero, then the magnetic characteristic of the iron core results in the voltage being imbalanced to a greater or lesser extent. When the magnetic field finally becomes zero as the compensation current rises, then this results in a balanced AC voltage. The sought measurement point has then been reached. In contrast with the compensation method described in relation to the prior art, there is no need to control the compensation current in this case. In fact, the measurement process can be terminated once the linear-rising compensation current has resulted in the magnetic field in the iron core becoming zero.

The use of such an indicator winding has the advantage over other magnetic field sensors that it is considerably more resistant to temperature. The temperature resistance depends only on the insulation class of the winding. Overtemperatures up to 200° C. may be acceptable, with appropriate insulation.

BRIEF DESCRIPTION OF THE DRAWINGS

The invention will be explained in more detail in the following text with reference to an exemplary embodiment. In the associated drawings.

DETAILED DESCRIPTION OF THE PREFERRED EMBODIMENTS

Figure 1:
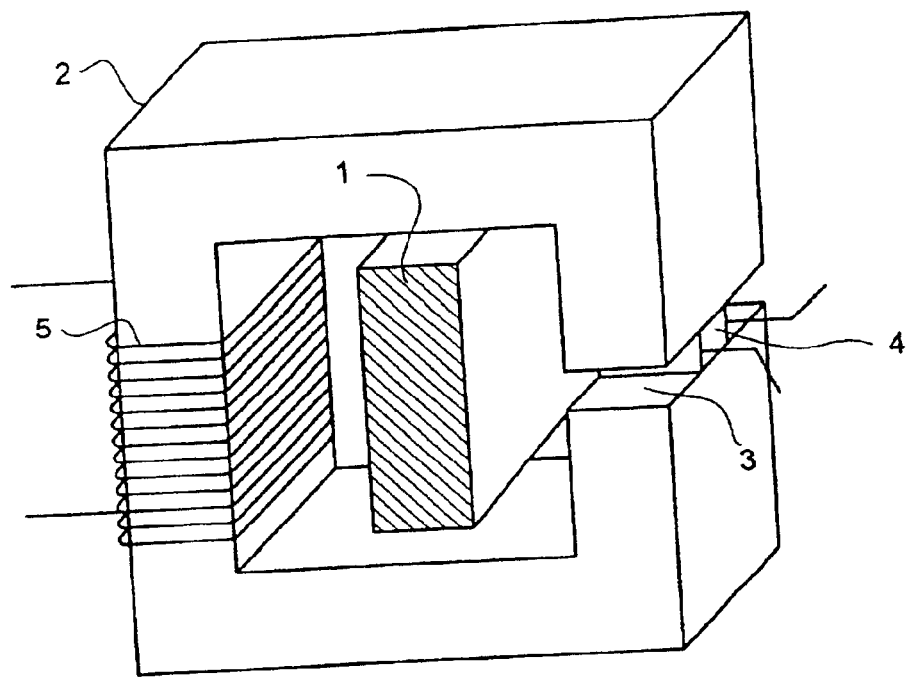
FIG. 1 shows an outline illustration of the arrangement required for the direct current transformer.

FIG. 1 shows an outline illustration of the arrangement which is required to carry out the method. A primary electrical conductor 1 of a DC network is passed through an iron core 2 of the direct current transformer. The iron core 2 is provided with an air gap 3 in which a magnetic field sensor 4 is accommodated. A secondary winding 5 is fitted to the iron core 2, and its current supplies the signal (current signal) to be evaluated.

Figure 3A:
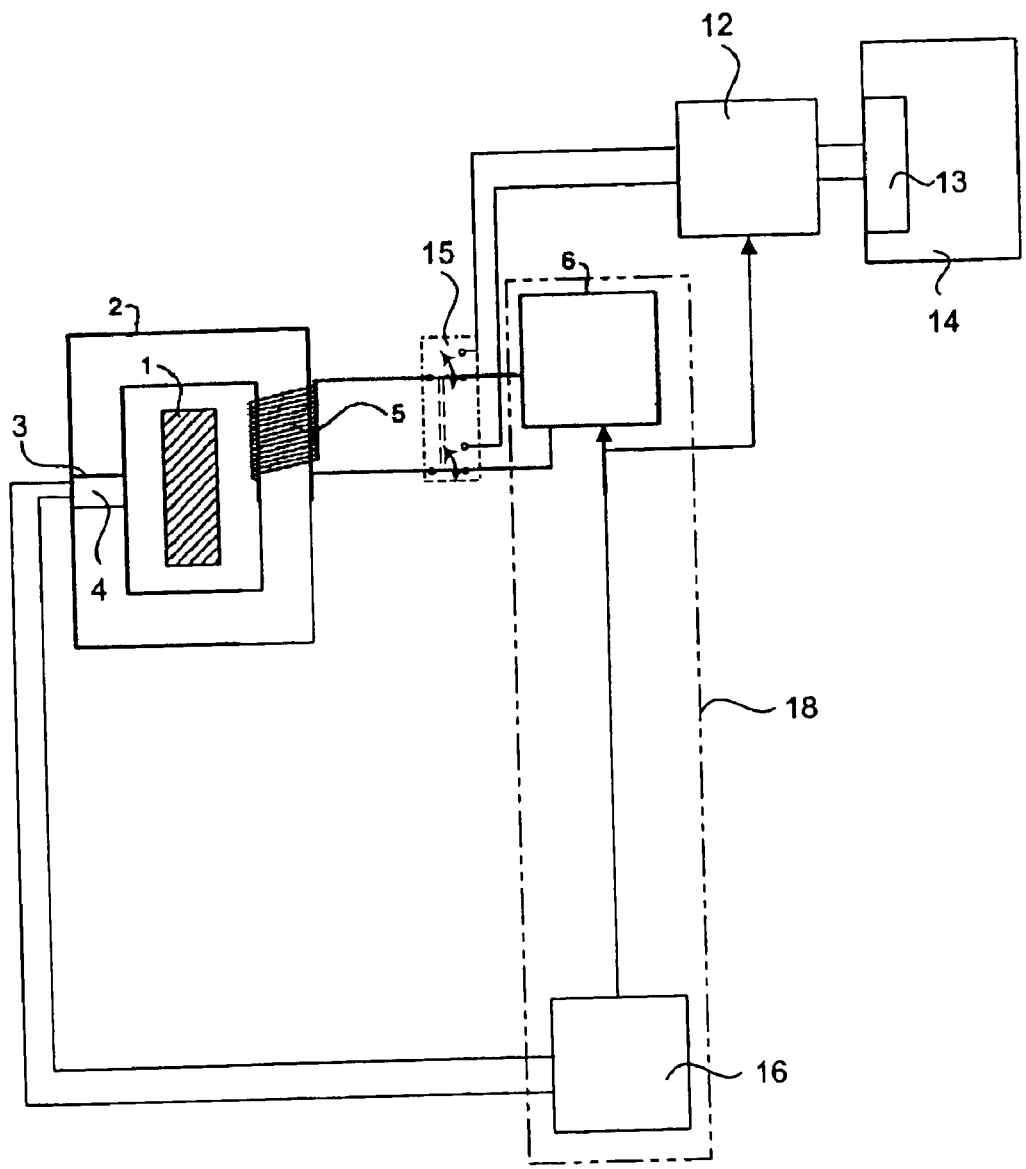
FIG. 3 shows four block diagrams of arrangements for compensation measurements.
Figure 3B:
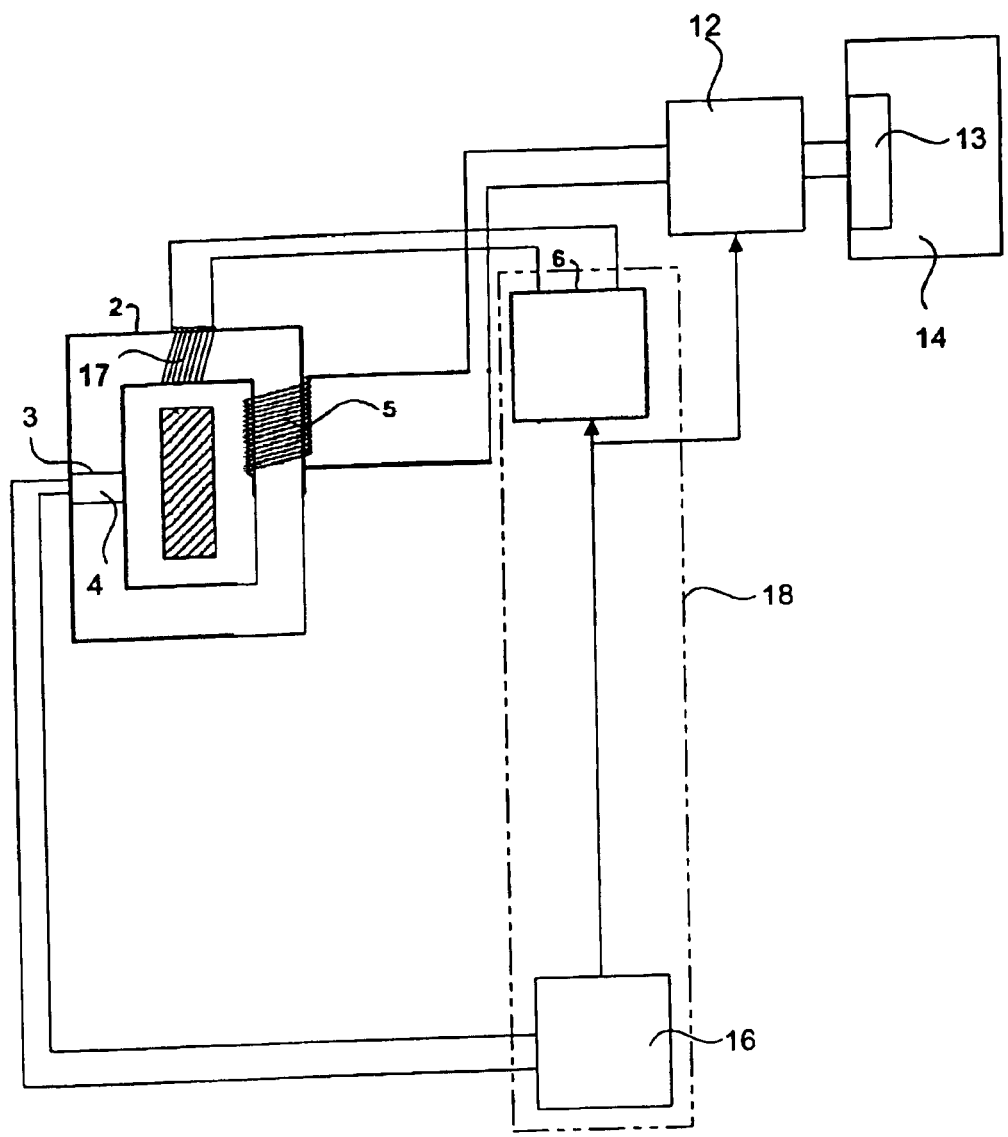

FIGS. 3a and 3b show block diagrams of two arrangements for the compensation measuring. The current signal is integrated in an integration circuit 12 and then supplies a model of the primary direct current $I_{Prim}$. The output of integration circuit 12 is connected to a trigger circuit 13 of a switchgear 14.

Figure 2:
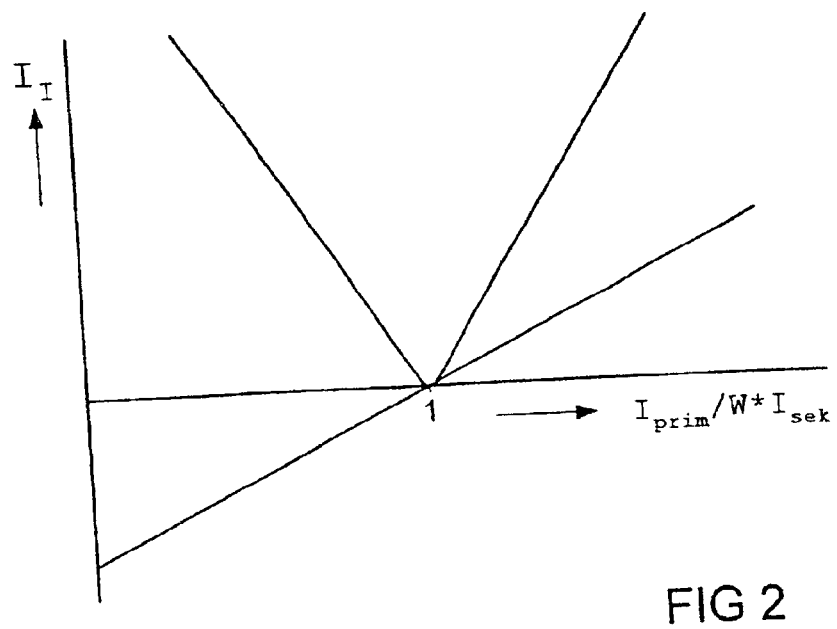
FIG. 2 shows the signal produced during regular trimming with various magnetic field sensors.

In order to adjust the integrated current value, a second current measurement is carried out with the aid of the magnetic field sensor 4. According to FIG. 3a, the current measurement process carried out until that point in time is briefly interrupted by means of a two-way switch 15 and a linear-rising compensation current $I_{sec}$, supplied by a direct current source 6, for example, is fed into the secondary winding 5 (used as a compensation winding) until the output signal $I_f$ of the magnetic field sensor 4 reaches a reversal point or a polarization change, as is shown in FIG. 2. The compensation current $I_{sec}$, multiplied by the number of turns w, corresponds to the primary direct current $I_{Prim}$ to be measured. The current value, which was previously determined by means of integration, is now corrected using this measured value.

For the arrangement according to FIG. 3b, the compensation current $I_{sec}$, supplied by the direct current source 6, which increases for example linearly, is fed to a separate compensation winding 17 that is wound around the iron core.

For an arrangement according to FIGS. 3a and 3b, the secondary winding 5 (used as a compensation winding) and/or the separate compensation winding 17 are connected to a compensation circuit 18 inclusive of the direct current source 6 and an evaluation circuit 16 that processes the current value from direct current source 6 with compensated magnetic field for compensating the integration circuit 12.

Figure 3C:
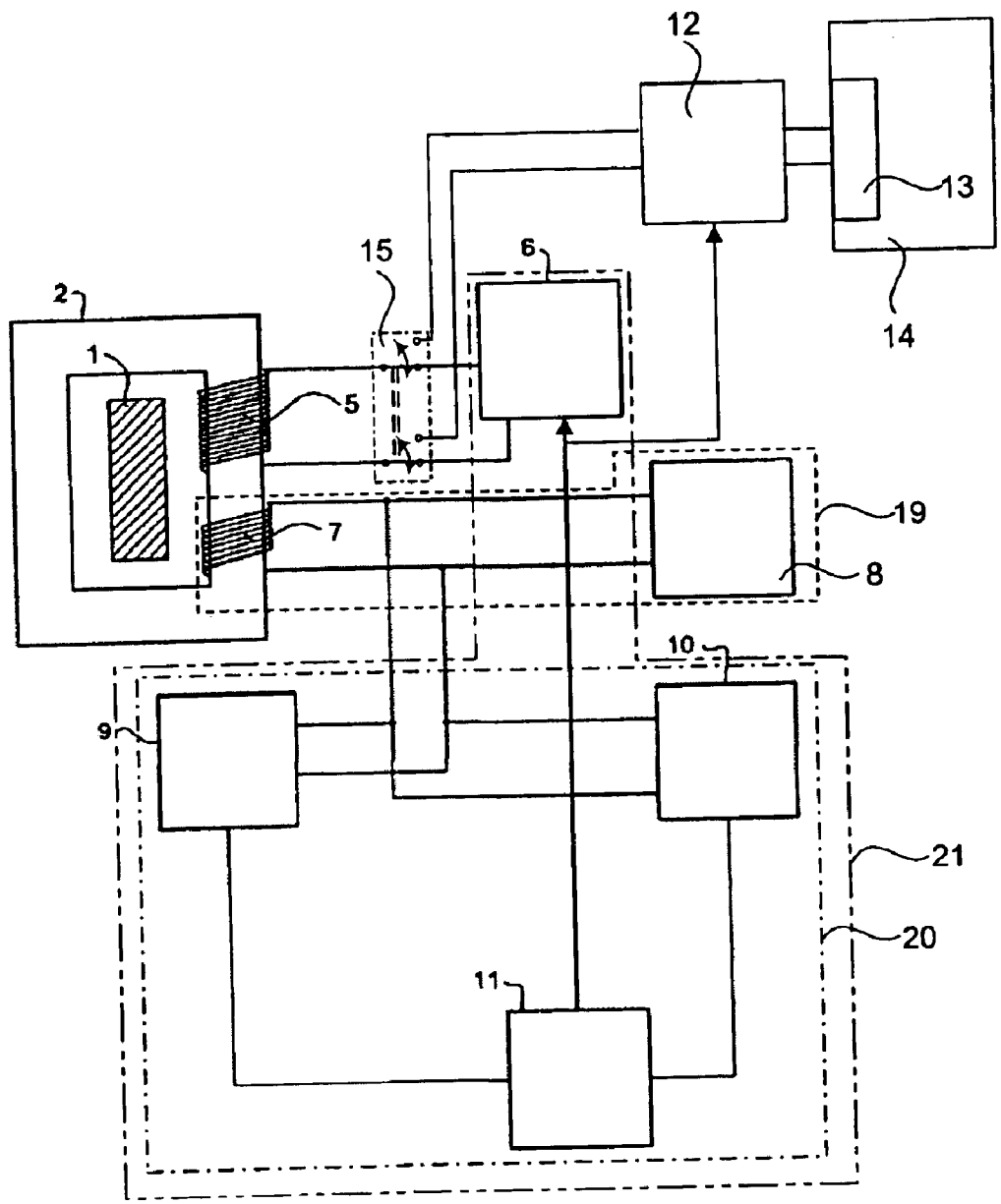
Figure 3D:
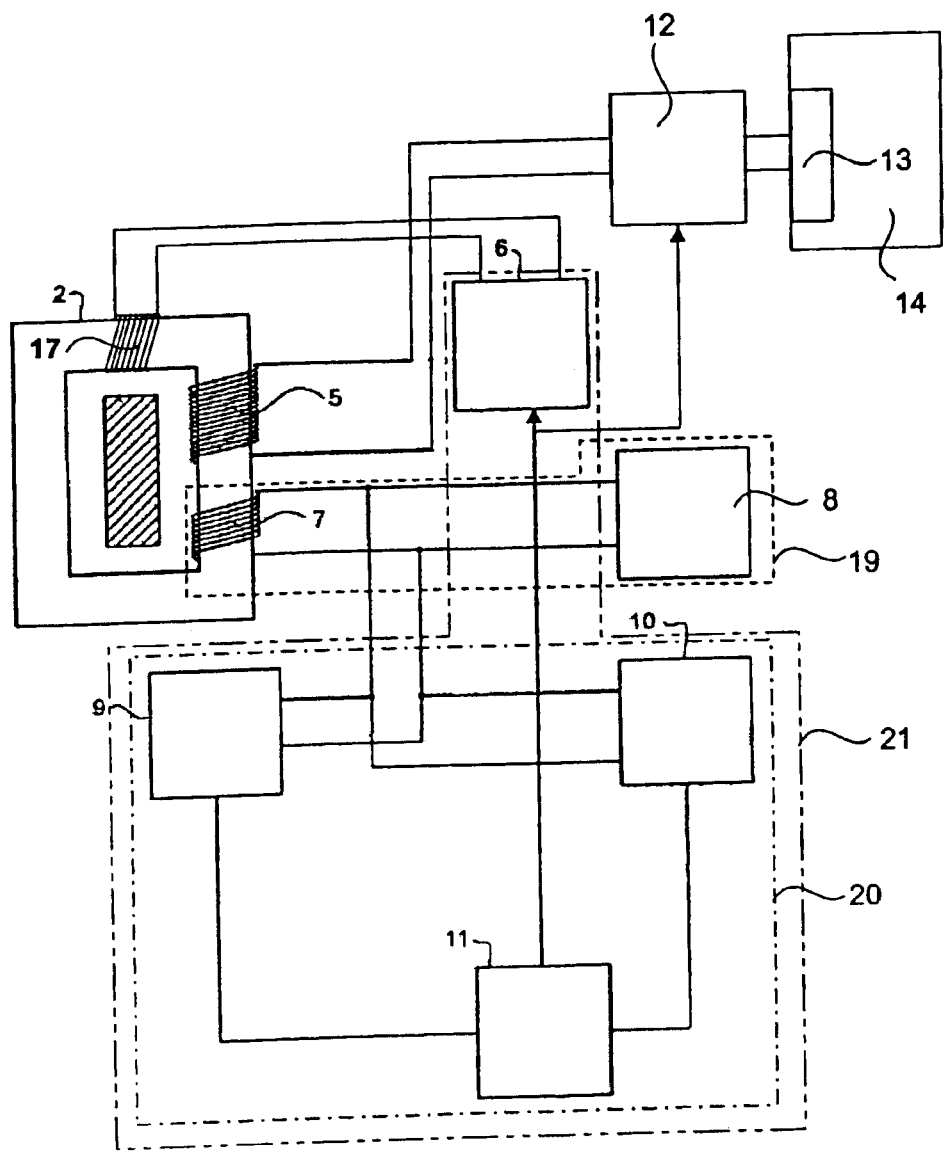

The arrangements according to FIGS. 3c and 3d show two additional options for obtaining the field measurement in the iron core 2.

With the arrangement according to FIG. 3c—as for the arrangement according to FIG. 3a—the secondary winding 5 is used as a compensation winding. The illustration shows only operation during the compensation phase. The secondary winding 5 is connected to a controllable DC source 6 which, for example, feeds a linear-rising current into the secondary winding 5.

With the arrangements according to FIG. 3d—as for the arrangement according to FIG. 3b—the separate compensation winding 16, which is wound around the iron core 3, is used for feeding the compensation current $I_{sec}$.

With the arrangement according to FIGS. 3c and 3d, a balanced alternating current, which is supplied from an AC source 8, is fed into an indicator winding 7. The indicator winding 7 that is supplied with the symmetrical alternating current from the alternating current source 8 thus forms a magnetic field sensor 19. The voltage across the indicator winding 7 is measured. In the positive half-cycle, the positive peak value is stored in a peak-value store 9, and in the negative half-cycle, the negative peak value is stored in a peak-value store 10. Capacitors, for example, are suitable for use as the peak-value stores. The two values are then compared in a comparator 11.

If the comparator value is not equal to zero, this means that the voltage is unbalanced, owing to the magnetic characteristics of the iron core 2 which has been premagnetized by the primary current $I_{Prim}$. The peak value memories 9 and 10 and the comparator 11 form an evaluation circuit 20. The direct current source 6 and the evaluation circuit 20 together form a compensation circuit 21.

If the comparator value is zero, then the measured AC voltage across the indicator winding 7 is balanced. This is therefore a measure that the magnetic field in the iron core is zero that is to say the primary direct current $I_{Prim}$ has been compensated. The current $I_{sec}$ in the secondary winding 5, which is used according to FIG. 3c as a compensation winding, and/or the current in the separate compensation winding 17 according to FIG. 3d, at this instant represents a measure of the primary direct current $I_{Prim}$. The value is retained in order to use it subsequently to correct the current value obtained using the integration method. The integration process and the current value correction can be expediently carried out digitally in a microprocessor, for example, which is not shown here. For use in a trigger circuit of a DC switching device, the trigger circuit can in any case, already be equipped with a microprocessor, for example, which can also be used for this purpose.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for reproducing direct currents with the aid of a primary winding through which a primary current to be measured flows and which is magnetically coupled to a secondary winding via an iron core, comprising:
   integrating a current signal supplied from the secondary winding;
   supplying the integrated current value to at least one of a measurement device and a trigger circuit of a switching device; and
   adjusting the supplied integrated current value at predetermined time intervals by the primary current to be measured, the adjustment being determined with the assistance of a magnetic field sensor for measuring the magnetic field in the iron core using a compensation method including,
   determining a current for setting a magnetic field in the iron core to zero, in a direction opposite to the primary current, in a compensation winding; and
   correcting the integrated current value based upon the determined current.

2. The method as claimed in claim 1, wherein the secondary winding is used as the compensation winding.

3. The method as claimed in claim 1, wherein a linear-rising direct current is fed into the secondary winding in order to carry out the compensation method.

4. A direct current transformer having a primary winding through which a direct current to be measured flows and which is magnetically coupled to a secondary winding via an iron core, comprising:
   a magnetic field sensor for measuring a magnetic field of the iron core;
   an integration circuit, connected to the secondary winding and having an output connected to at least one of a measurement device and a trigger circuit of a switching device, for integrating a current signal supplied from the secondary winding and for supplying an integrated current value to at least one of the measurement device and the trigger circuit; and
   a compensation circuit, connected to at least one of the secondary winding via a changeover switch and a separate compensation winding wound on the iron core, for compensating the magnetic field, the compensation circuit including
   a controllable DC source; and
   an evaluation circuit for processing a current value of the DC source when the magnetic field has been compensated, in order to adjust the integrated current value of the integration circuit at predetermined time intervals.

5. The direct current transformer as claimed in claim 4, wherein the iron core includes an air gap wherein the magnetic field sensor is arranged in at least one of the air gap and a vicinity of the air gap.

6. The direct current transformer as claimed in claim 4, wherein the magnetic field sensor is a Hall probe.

7. The direct current transformer as claimed in claim 4, wherein the magnetic field sensor is a magnetoresistive sensor.

8. The direct current transformer as claimed in claim 4, wherein the magnetic field sensor is an indicator winding to which a balanced alternating current can be applied and whose voltage imbalance can be evaluated in the evaluation circuit in order to measure the magnetic field in the iron core.

9. The method of claim 1, wherein a linear-rising direct current is fed into a separate compensation winding in order to carry out the compensation method.

10. The direct current transformer as claimed in claim 5, wherein the magnetic field sensor is a Hall probe.

11. The direct current transformer as claimed in claim 5, wherein the magnetic field sensor is a magnetoresistive sensor.

12. The direct current transformer as claimed in claim 5, wherein the magnetic field sensor is an indicator winding to which a balanced alternating current can be applied and whose voltage imbalance can be evaluated in the evaluation circuit in order to measure the magnetic field in the iron core.

* * * * *